United States Patent
Katrak

(10) Patent No.: US 10,309,993 B2
(45) Date of Patent: Jun. 4, 2019

(54) VOLTAGE MONITORING SYSTEM UTILIZING FIRST AND SECOND BANKS OF CHANNELS AND EXCHANGED ENCODED CHANNEL NUMBERS FOR TAKING REDUNDANT SAFE ACTION

(71) Applicant: LG Chem, Ltd., Seoul (KR)

(72) Inventor: Kerfegar K. Katrak, Fenton, MI (US)

(73) Assignee: LG Chem, Ltd., Seoul (KR)

( * ) Notice: Subject to any disclaimer, the term of this patent is extended or adjusted under 35 U.S.C. 154(b) by 8 days.

(21) Appl. No.: 15/657,441

(22) Filed: Jul. 24, 2017

(65) Prior Publication Data
US 2019/0025352 A1 Jan. 24, 2019

(51) Int. Cl.
*G01R 19/25* (2006.01)

(52) U.S. Cl.
CPC ................ *G01R 19/2513* (2013.01)

(58) Field of Classification Search
CPC .................................. G01R 19/2513
See application file for complete search history.

(56) References Cited

U.S. PATENT DOCUMENTS 8,253,419 B2    8/2012  Heeringa et al.
9,444,332 B2 *  9/2016  Bizjak ................... H02M 3/156
9,935,552 B2 *  4/2018  Katrak .................. H02J 7/0065

OTHER PUBLICATIONS

U.S. Appl. No. 15/657,305, filed Jul. 24, 2017 entitled Voltage Monitoring System.
U.S. Appl. No. 15/657,357, filed Jul. 24, 2017 entitled Voltage Monitoring System Utilizing a Common Channel and Exchanged Encoded Channel Numbers to Confirm Valid Voltage Values.

* cited by examiner

*Primary Examiner* — Reena Aurora
(74) *Attorney, Agent, or Firm* — Buckert Patent & Trademark Law Firm PC; John F. Buckert

(57) ABSTRACT

A voltage monitoring system having a microcontroller with first and second monitoring applications and a hardware abstraction layer is provided. The hardware abstraction layer obtains a first measured voltage value associated with a first channel number. The hardware abstraction layer determines a second encoded channel number based on the first channel number. The hardware abstraction layer sends a first response message having the second encoded channel number and a first measured voltage value therein to the first monitoring application. The first monitoring application commands the microcontroller to generate first and second control signals to transition a contactor to an open operational state, if the second encoded channel number is not equal to a first expected encoded channel number.

19 Claims, 10 Drawing Sheets

FIG. 5

FIRST TABLE — 500

| ENCODED CHANNEL NUMBER | CHANNEL NUMBER |
|---|---|
| D4 | 2 |

SECOND TABLE — 520

| CHANNEL NUMBER | ENCODED CHANNEL NUMBER |
|---|---|
| 2 | D4 |

THIRD TABLE — 540

| EXPECTED ENCODED CHANNEL NUMBER |
|---|
| D4 |

FOURTH TABLE — 560

| EXPECTED ENCODED CHANNEL NUMBER |
|---|
| 71 |

FIFTH TABLE — 580

| ENCODED CHANNEL NUMBER | CHANNEL NUMBER |
|---|---|
| 71 | 8 |

582

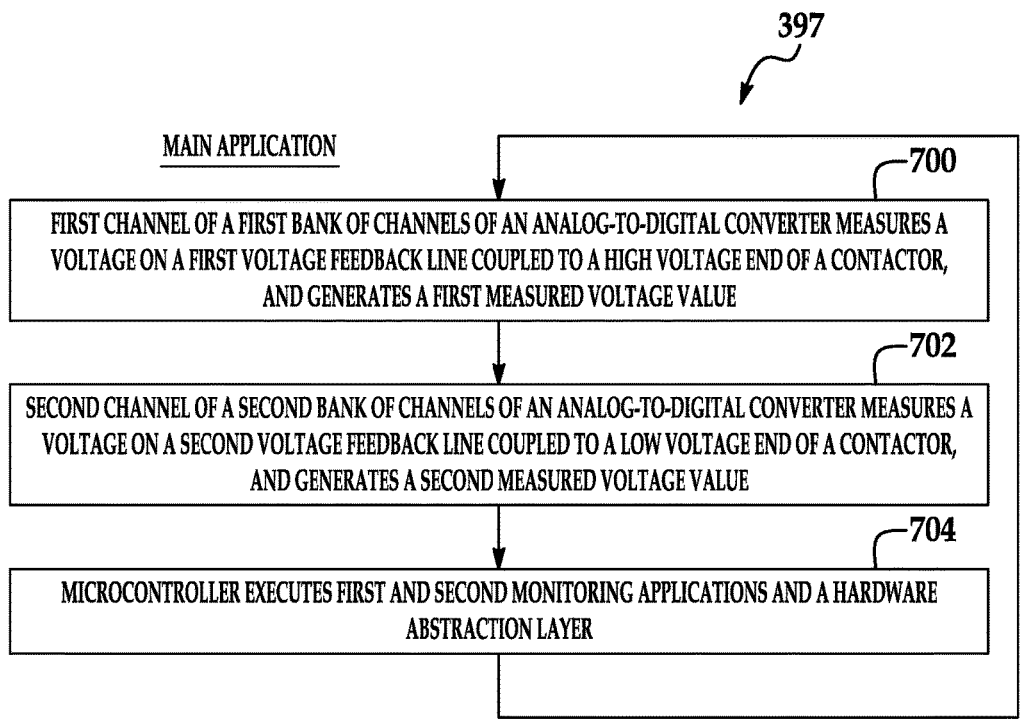

VOLTAGE MONITORING SYSTEM UTILIZING FIRST AND SECOND BANKS OF CHANNELS AND EXCHANGED ENCODED CHANNEL NUMBERS FOR TAKING REDUNDANT SAFE ACTION

BACKGROUND

The inventor herein has recognized a need for an improved voltage monitoring system since other systems may inadvertently obtain incorrect voltage values from incorrect voltage channels due to software errors or a malfunctioning microcontroller, and may not be able to detect that incorrect voltage values were obtained.

The voltage monitoring system described herein advantageously utilizes first and second monitoring applications that are simultaneously executed. The first monitoring application communicates with the hardware abstraction layer utilizing encoded channel numbers to reliably obtain a desired voltage value from a first bank of channels of analog-to-digital converter. Further, if a received encoded channel number from the hardware abstraction layer does not match an expected encoded channel number, the first monitoring application transitions a contactor to an open operational state, and further sends the received encoded channel number to the second monitoring application which also transitions the contactor to an open operational state. Thus, the voltage monitoring system can more reliably ensure that system software is not obtaining incorrect voltage values from an analog-to-digital converter. Further, the voltage monitoring system can take redundant safe action, by having the first and second monitoring applications both open the contactor, if an incorrect voltage value is received.

SUMMARY

A voltage monitoring system in accordance with an exemplary embodiment is provided. The voltage monitoring system includes a first voltage feedback line that is coupled to a high voltage end of a contactor. The voltage monitoring system further includes a second voltage feedback line that is coupled to a low voltage end of the contactor. The voltage monitoring system further includes a microcontroller having an analog-to-digital converter and a memory device. The microcontroller further includes first and second monitoring applications and a hardware abstraction layer. The analog-to-digital converter has a first bank of channels and a second bank of channels. A first channel of the first bank of channels is electrically coupled to the first voltage feedback line. A second channel of the second bank of channels is electrically coupled to the second voltage feedback line. The first monitoring application sends a first request message to the hardware abstraction layer that requests a first measured voltage value from the first channel of the first bank of channels coupled to the first voltage feedback line. The first request message has a first encoded channel number associated with the first channel of the first bank of channels. The hardware abstraction layer determines a first channel number based on the first encoded channel number. The first channel number is associated with the first channel of the first bank of channels. The hardware abstraction layer obtains a first measured voltage value associated with the first channel number. The hardware abstraction layer determines a second encoded channel number based on the first channel number. The hardware abstraction layer sends a first response message having the second encoded channel number and the first measured voltage value therein to the first monitoring application. The first monitoring application commands the microcontroller to generate first and second control signals to transition the contactor to an open operational state, if the second encoded channel number is not equal to a first expected encoded channel number.

BRIEF DESCRIPTION OF THE DRAWINGS

FIG. 5 is a first table that is utilized by the first monitoring application of the voltage monitoring system of FIG. 1;

FIG. 6 is a second table that is utilized by the first monitoring application of the voltage monitoring system of FIG. 1;

FIG. 7 is a third table that is utilized by the first monitoring application of the voltage monitoring system of FIG. 1;

FIG. 8 is a fourth table that is utilized by the first monitoring application of the voltage monitoring system of FIG. 1;

FIG. 9 is a fifth table that is utilized by the second monitoring application of the voltage monitoring system of FIG. 1;

FIG. 10 is a sixth table that is utilized by the second monitoring application of the voltage monitoring system of FIG. 1;

FIG. 11 is a seventh table that is utilized by the second monitoring application of the voltage monitoring system of FIG. 1;

FIG. 12 is an eighth table that is utilized by the second monitoring application of the voltage monitoring system of FIG. 1; and FIGS. 13-19 is a flowchart of a method for obtaining voltage measurements utilizing the voltage monitoring system of FIG. 1.

DETAILED DESCRIPTION

Figure 1:
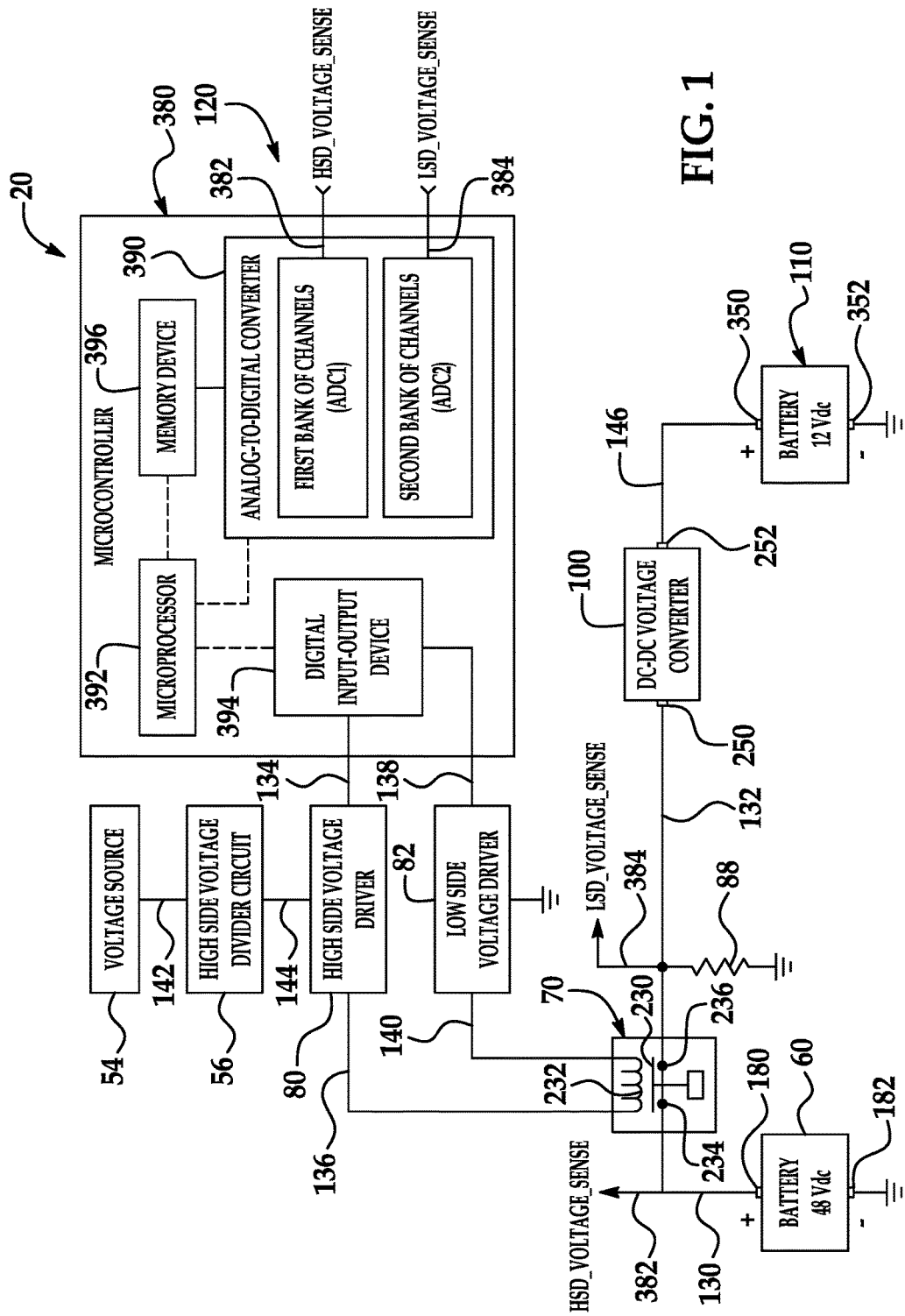
FIG. 1 is a schematic of a vehicle having a voltage monitoring system in accordance with an exemplary embodiment.
Figure 2:
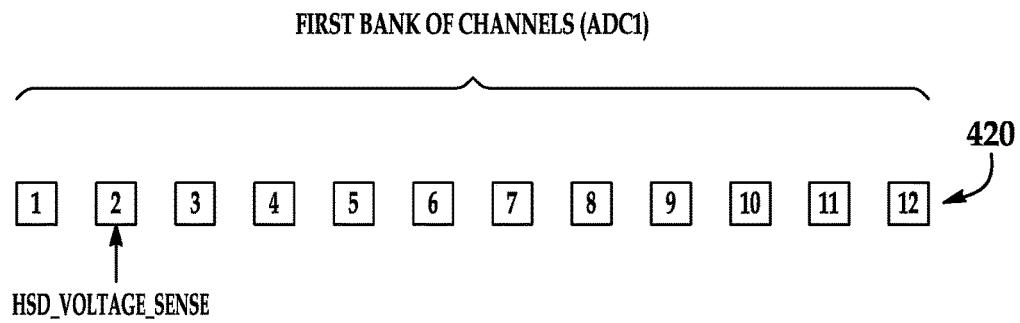
FIG. 2 is a schematic of a first bank of channels in an analog-to-digital converter utilized in the voltage monitoring system of FIG. 1.

Referring to FIGS. 1-4, a vehicle 20 is provided. The vehicle 20 includes a voltage source 54, a high side voltage divider circuit 56, a battery 60, a contactor 70, a high side voltage driver 80, a low side voltage driver 82, a resistor 88, a DC-DC voltage converter 100, a battery 110, a voltage monitoring system 120, and electrical lines 130, 132, 134, 136, 138, 140, 142, 144, 146.

Figure 4:
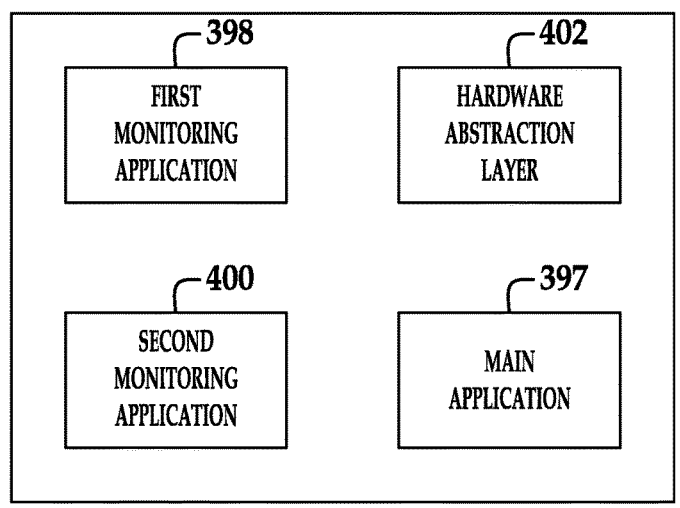
FIG. 4 is block diagram of a main program, a first monitoring application, a second monitoring application, and a hardware abstraction layer that are utilized in the voltage monitoring system of FIG. 1.
Figure 14:
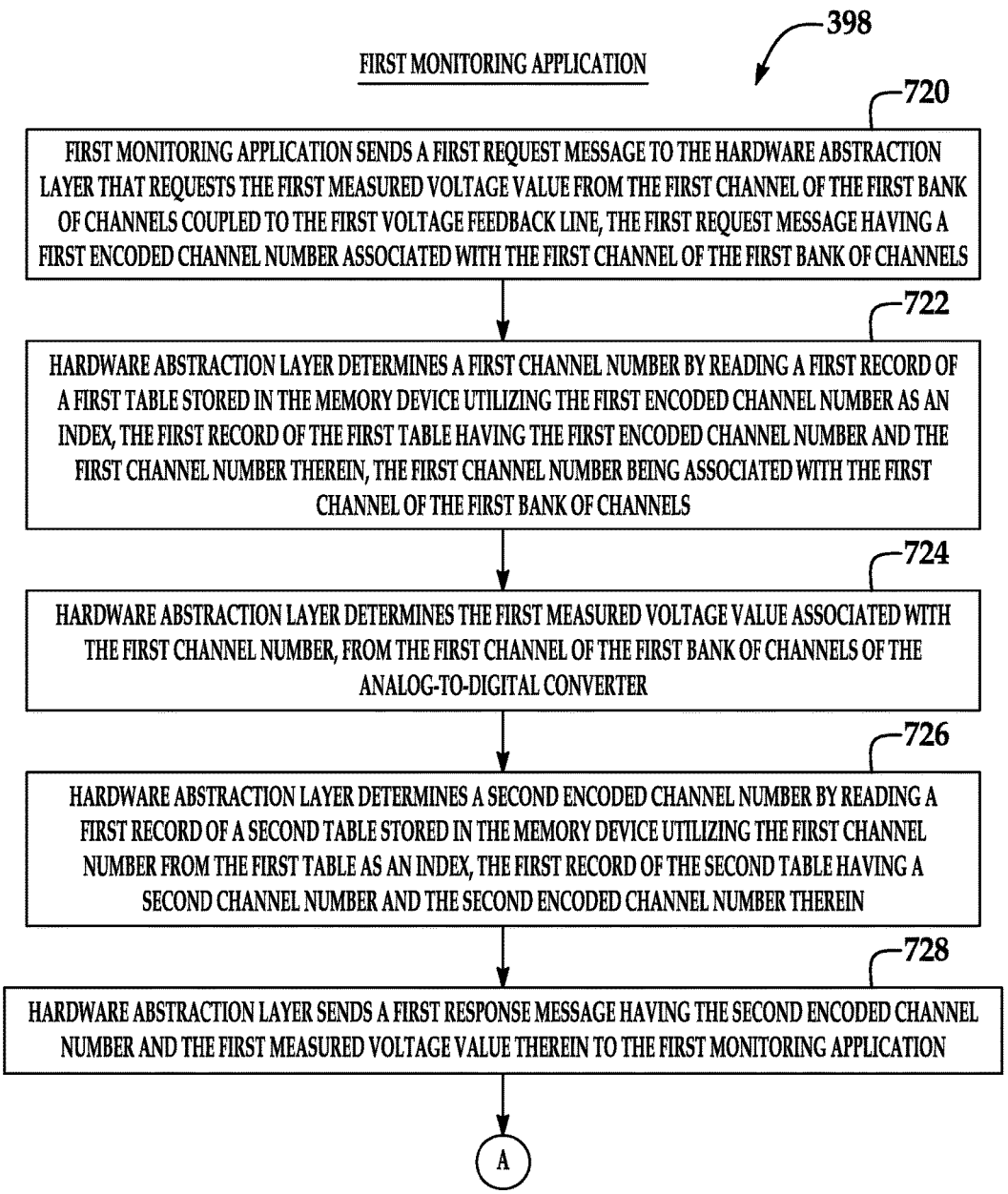
Figure 15:
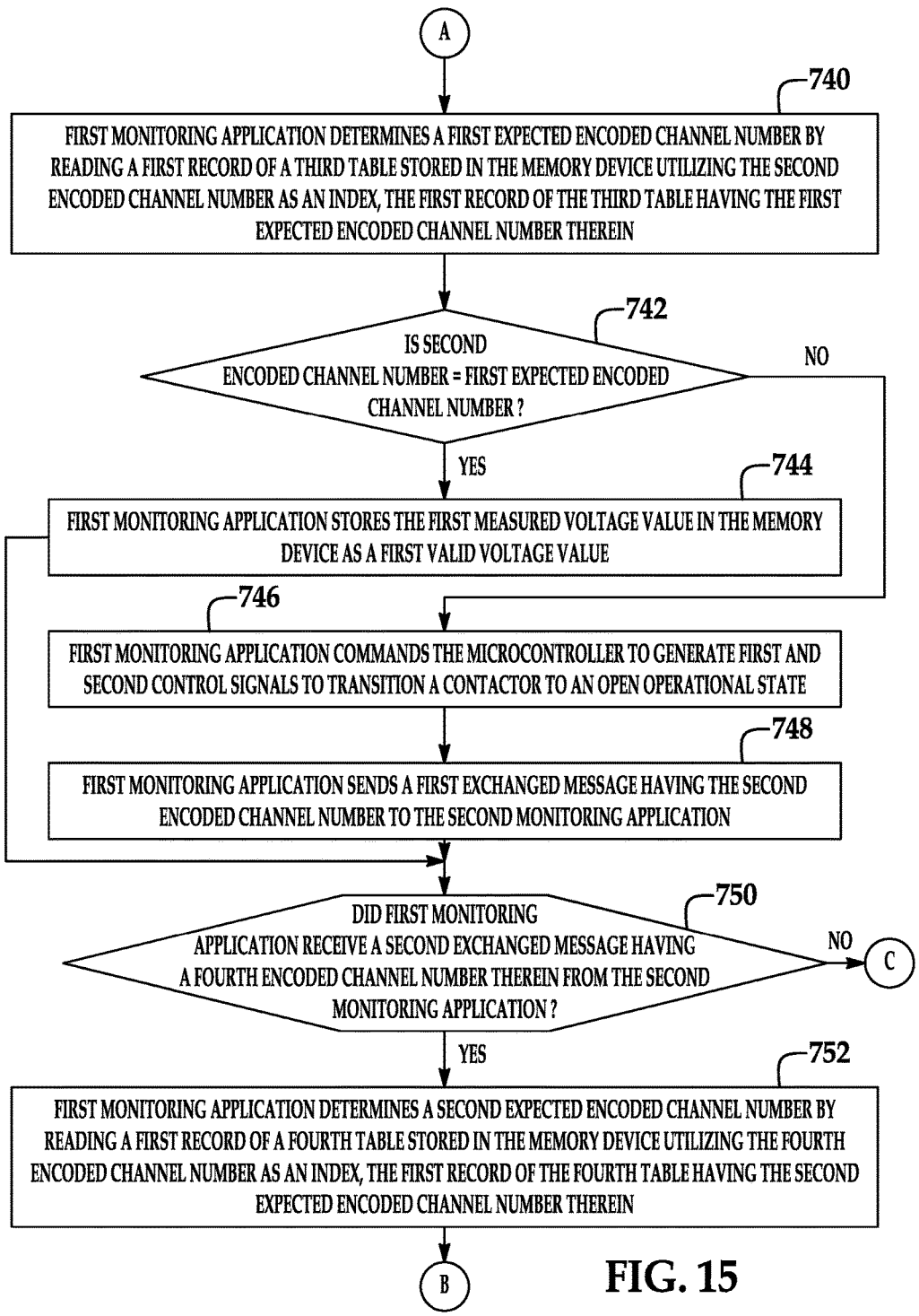
Figure 16:
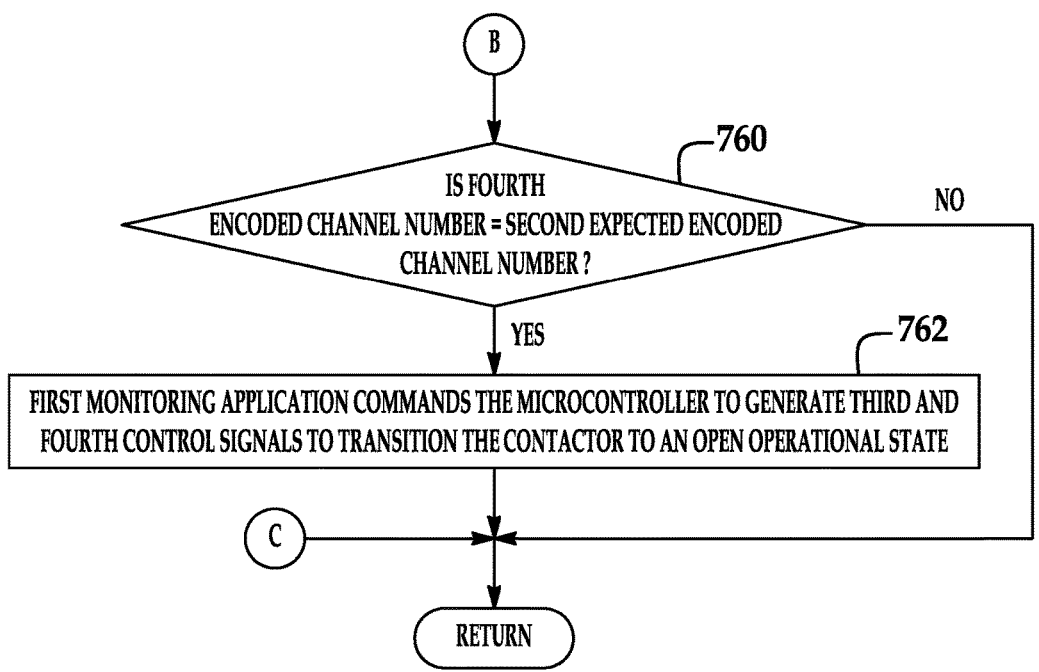
Figure 17:
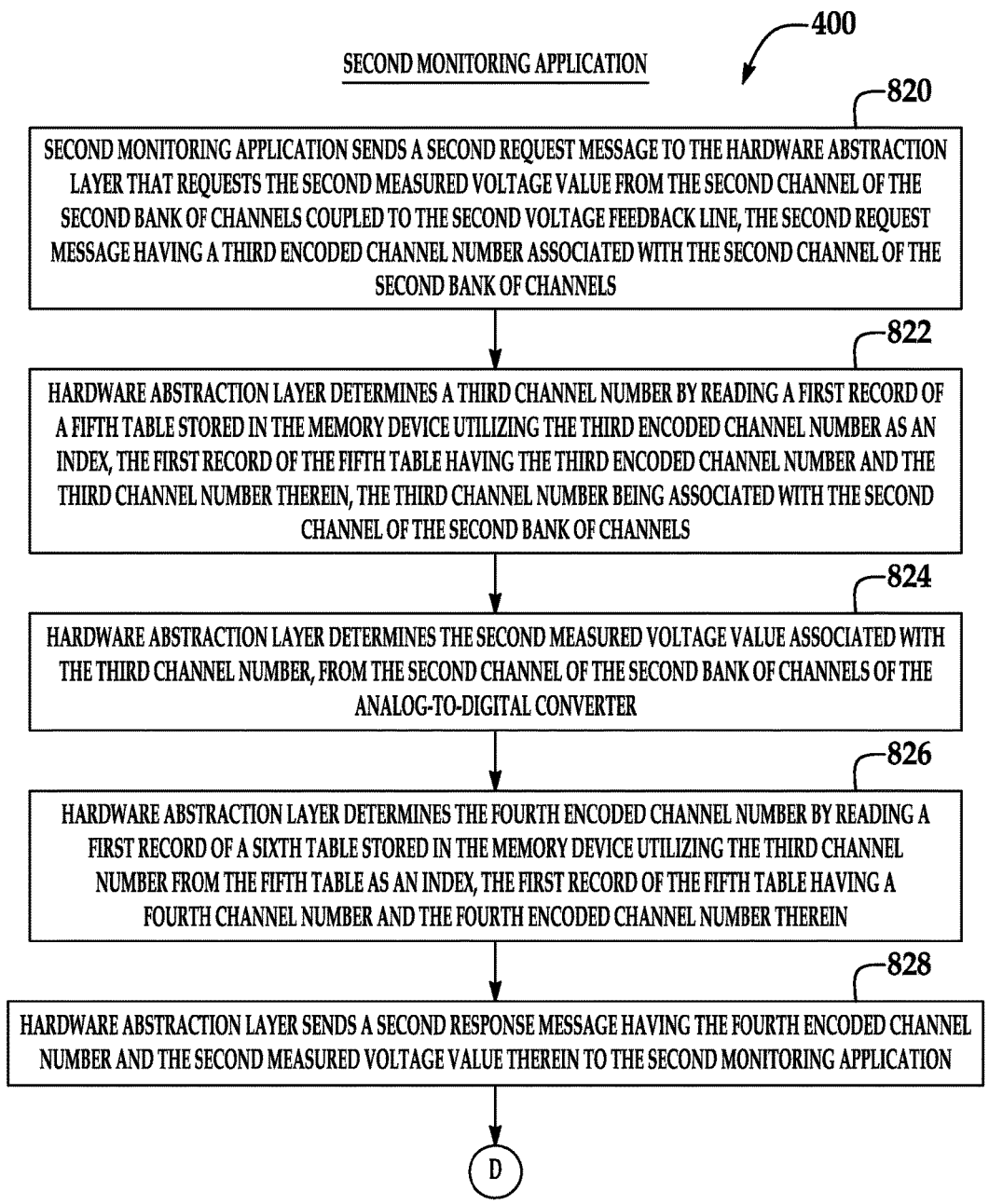
Figure 18:
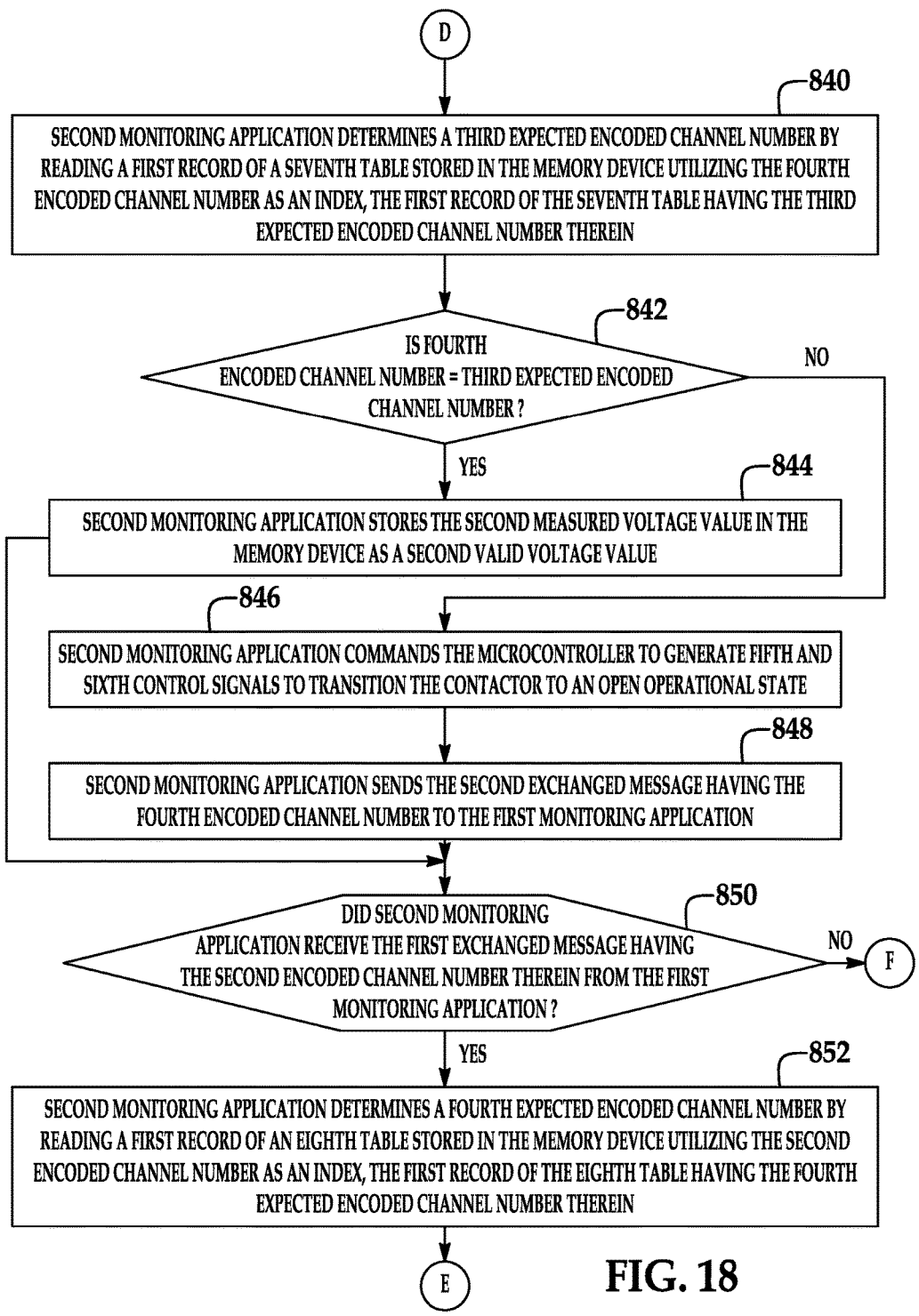
Figure 19:
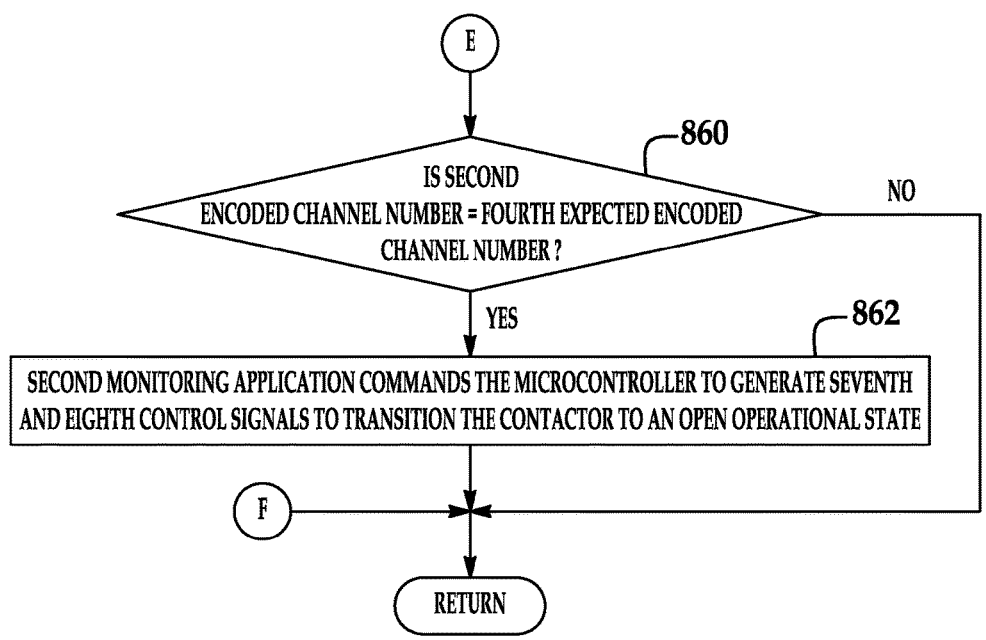

Referring to FIGS. 1 and 4, an advantage of the voltage monitoring system 120 is that the system 120 utilizes first and second monitoring applications 398, 400 that are simultaneously being executed. The first monitoring application 398 communicates with the hardware abstraction layer 402 utilizing encoded channel numbers to reliably obtain a desired voltage value from a first bank of channels 420 of the analog-to-digital converter 390. Further, if a received encoded channel number from the hardware abstraction layer 402 does not match an expected encoded channel number indicating that an incorrect voltage value was obtained, the first monitoring application 398 transitions a contactor 70 to an open operational state, and further sends the received encoded channel number to the second monitoring application 400 which also transitions the contactor 70 to an open operational state. Thus, the voltage monitoring system 120 can detect if the system software is obtaining incorrect voltage values from the analog-to-digital converter 390 utilizing encoded channel numbers. Further, the voltage monitoring system 120 can take redundant safe action, by having the first and second monitoring applications 398, 400 both open the contactor 70, if an incorrect voltage value is received.

For purposes of understanding, a node is a region or a location in an electrical circuit.

Referring to FIG. 1, the voltage source 54 is provided to generate a first voltage (e.g., 48 Vdc) that is received by the high side voltage divider circuit 56. The voltage source 54 is electrically coupled to the high side voltage divider circuit utilizing the electrical line 142. The high side voltage divider circuit 56 receives the first voltage from the voltage source 54 and outputs a second voltage that is received by the high side voltage driver 80 utilizing the electrical line 144.

The battery 60 includes a positive terminal 180 and a negative terminal 182. In an exemplary embodiment, the battery 60 generates 48 Vdc between the positive terminal 180 and the negative terminal 182. The positive terminal 180 is electrically coupled to a node 234 of the contactor 70. The negative terminal 182 is electrically coupled to electrical ground.

The contactor 70 has a contact 230, a contactor coil 232, a first node 234, and a second node 236. The first node 234 is electrically coupled to the positive terminal 180 of the battery 60 utilizing the electrical line 130. The second node 236 is electrically coupled to the first node 250 of the DC-DC voltage converter 100 utilizing the electrical line 132. When the digital input-output device 394 of the microcontroller 380 generates first and second control signals that are received by the high side voltage driver 80 and the low side voltage driver 82, respectively, the contactor coil 232 is energized which transitions the contact 230 to a closed operational state. Alternately, when the digital input-output device 394 of the microcontroller 380 generates third and fourth control signals that are received by the high side voltage driver 80 and the low side voltage driver 82, respectively, the contactor coil 232 is de-energized which transitions the contact 230 to an open operational state. In an exemplary embodiment, the third and fourth control signals can each be a ground voltage level.

The high side voltage driver 80 and the low side voltage driver 82 are provided to energize or de-energize the contactor coil 232.

The high side voltage driver 80 is electrically coupled to a digital input-output device 394 of the microcontroller 380 utilizing the electrical line 134. The high side voltage driver 80 is further electrically coupled to a first end of the contactor coil 232 utilizing the electrical line 136. The high side voltage driver 80 is further electrically coupled to the high side voltage divider circuit 56 via the electrical line 144. The high side voltage driver 144 utilizes the second voltage from the high side voltage divider circuit 56 and outputs a pulse width modulated signal on electrical line 136 for energizing the contactor coil 232, when the high side voltage driver 144 receives a control signal from the digital input-output device 394.

The low side voltage driver 82 is electrically coupled to the digital input-output device 394 of the microcontroller 380 utilizing the electrical line 138. The low side voltage driver 82 is further electrically coupled to a second end of the contactor coil 232 utilizing the electrical line 140. The low side voltage driver 82 is configured to conduct an electrical current therethrough to the electrical ground for energizing the contactor coil 232, when the low side voltage driver 82 receives a control signal from the digital input-output device 394.

The resistor 88 is electrically coupled between the second node 236 of the contactor 70 and electrical ground. A voltage (e.g., LSD_Voltage_Sense) across the resistor 88 indicates a voltage at the second node 236 of the contactor 70.

The DC-DC voltage converter 100 includes a first node 250 and a second node 252. The first node 250 is electrically coupled to the second node 236 of the contactor 70 utilizing the electrical line 132. The second node 252 is electrically coupled to the positive terminal 350 of the battery 110 utilizing the electrical line 146. In a first operational mode, the DC-DC voltage converter 100 outputs a voltage from the node 252 for charging the battery 110. In a second operational mode, the DC-DC voltage converter 100 outputs a voltage at the first node 250 for charging the battery 60.

The battery 110 includes a positive terminal 350 and a negative terminal 352. In an exemplary embodiment, the battery 110 generates 12 Vdc between the positive terminal 350 and the negative terminal 352. The positive terminal 350 is electrically coupled to the second node 252 of the DC-DC voltage converter 100. The negative terminal 352 is electrically coupled to an electrical ground, which may be electrically isolated from the electrical ground associated with the battery 60.

Referring to FIGS. 1 and 4, the voltage monitoring system 120 is utilized to monitor voltages at a high voltage end (e.g., at first node 234) of the contactor 70 and a low voltage end (e.g., at second node 236) of the contactor 70. The voltage monitoring system 120 includes a microcontroller 380 and the voltage feedback lines 382, 384. The microcontroller 380 has an analog-to-digital converter 390, a microprocessor 392, a digital input-output device 394, a memory device 396, a main application 397, first and second monitoring applications 398, 400, and a hardware abstraction layer 402.

Figure 3:
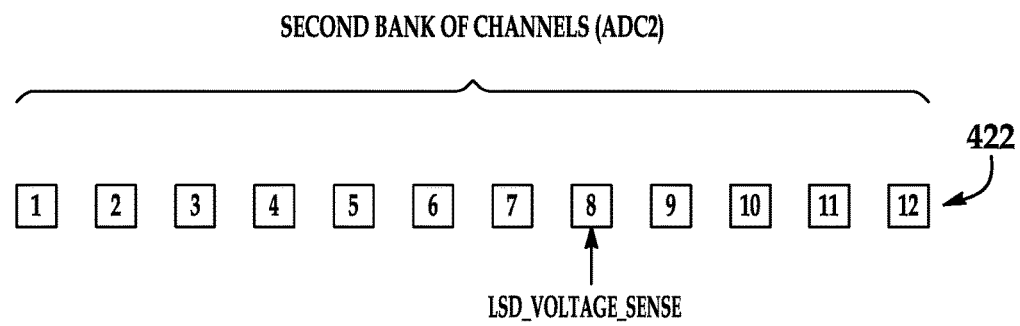
FIG. 3 is a schematic of a second bank of channels in an analog-to-digital converter utilized in the voltage monitoring system of FIG. 1.

Referring to FIGS. 1 and 3, the analog-to-digital converter 390 includes a first bank of channels 420 (also referred to as "ADC1") and a second bank of channels 422 (also referred to as "ADC2"). The first bank of channels 420 includes channels 1, 2, 3, 4, 5, 6, 7, 8, 9, 10, 11 and 12. Further, the second bank of channels 422 includes channels 1, 2, 3, 4, 5, 6, 7, 8, 9, 10, 11 and 12.

The channel 2 of the first bank of channels 420 is electrically coupled to the high voltage end (e.g., first node 234) of the contactor 70 via the voltage feedback line 382. The channel 2 of the first bank of channels 420 measures the voltage (HSD_Voltage_Sense) and generates a measured voltage value therefrom.

The channel 8 of the second bank of channels 422 is electrically coupled to the low voltage end (e.g., second node 236) of the contactor 70 via the voltage feedback line 384. The channel 8 of the second bank of channels 422 measures the voltage (LSD_Voltage_Sense) and generates a measured voltage value therefrom.

The microcontroller 380 is programmed to monitor voltages (described in flowcharts herein) utilizing the microprocessor 392 which executes software instructions stored in the memory device 396. The microprocessor 392 is operably coupled to the analog-to-digital converter 390, the digital input-output device 394, and the memory device 396. The digital input-output device 394 can output digital control signals that are received by the voltage drivers 80, 82 for controlling the operation of the contactor 70. The memory device 396 stores data, the main application 397, the first monitoring application 398, the second monitoring application 400, and the hardware abstraction layer 402 therein. The memory device 396 further stores the first table 500 (shown in FIG. 5) and the second table 520 (shown in FIG. 6), the third table 540 (shown in FIG. 7), the fourth table 560 (shown in FIG. 8), the fifth table 580 (shown in FIG. 9), the sixth table 600 (shown in FIG. 10), the seventh table 620 (shown in FIG. 11), and the eighth table 640 (shown in FIG. 12) therein.

Referring to FIGS. 1 and 4, the microprocessor 392 executes the main application 397, the first and second monitoring applications 398, 400, and a hardware abstraction layer 402. The main application 397, the first and second monitoring applications 398, 400, and the hardware abstraction layer 402 are implemented with software instructions that allow communication between the first and second monitoring applications 398, 400 and the hardware abstraction layer 402 for obtaining voltage values from the analog-to-digital converter 390. The hardware abstraction layer 402 is associated with the analog-to-digital converter 390 and extracts voltage values generated by the analog-to-digital converter 390 which are sent to the first and second monitoring applications 398, 400. In an exemplary embodiment, the hardware abstraction layer 402 is a layer of programming (e.g., low-level programs or applications) that allows the main application 397, the first and second monitoring applications 398, 400, and an operating system (stored in the memory device 396) of the microcontroller 380 to interact with the analog-to-digital converter 390 at a general or abstract level rather than at a detailed hardware level. The hardware abstraction layer 402 can be called from the main application 397, the first and second monitoring applications 398, 400, or from the operating system to obtain voltage values from the analog-to-digital converter 390.

Referring to FIG. 5, a first table 500 that is utilized by the first monitoring application 398 in the voltage monitoring system 120 is illustrated. The first table 500 includes a record 502. The record 502 has a first encoded channel number D4 (which is a hexadecimal value) and a first channel number 2 (which is the decimal value). The first encoded channel number D4 is associated with the channel 2 in the first bank of channels 420. The first channel number 2 is associated with the channel 2 in the first bank of channels 420. In an alternative embodiment, the channel 2 in the first bank of channels 420 could be electrically coupled to another voltage source or other electrical device having a voltage to be measured.

Referring to FIG. 6, a second table 520 that is utilized by the first monitoring application 398 in the voltage monitoring system 120 is illustrated. The second table 520 includes a record 522. The record 522 has a second channel number 2 (which is the decimal value) and a second encoded channel number D4 (which is a hexadecimal value). The second channel number 2 is associated with the channel 2 in the first bank of channels 420. The second encoded channel number D4 is associated with the channel 2 in the first bank of channels 420.

Referring to FIG. 7, a third table 540 that is utilized by the first monitoring application 398 in the voltage monitoring system 120 is illustrated. The third table 540 includes a record 542. The record 542 has a first expected encoded channel number D4 (which is a hexadecimal value). The first expected encoded channel number D4 is associated with the channel 2 in the first bank of channels 420.

Referring to FIG. 8, a fourth table 560 that is utilized by the first monitoring application 398 in the voltage monitoring system 120 is illustrated. The fourth table 560 includes a record 562. The record 562 has a second expected encoded channel number 72 (which is a hexadecimal value). The second expected encoded channel number 71 is associated with the channel 8 in the second bank of channels 422.

Referring to FIG. 9, a fifth table 580 that is utilized by the second monitoring application 400 in the voltage monitoring system 120 is illustrated. The fifth table 580 includes a record 582. The record 582 has a third encoded channel number 71 (which is a hexadecimal value) and a third channel number 8 (which is the decimal value). The third encoded channel number 71 is associated with the channel 8 in the second bank of channels 422. The third channel number 8 is associated with the channel 8 in the second bank of channels 422. In an alternative embodiment, the channel 8 in the second bank of channels 422 could be electrically coupled to another voltage source or other electrical device having a voltage to be measured. It is note that the third encoded channel number 71 has a Hamming distance of at least four from the first encoded channel number D4 (shown in FIG. 5).

Referring to FIG. 10, a sixth table 600 that is utilized by the second monitoring application 400 in the voltage monitoring system 120 is illustrated. The sixth table 600 includes a record 602. The record 602 has a fourth channel number 8 (which is the decimal value) and a fourth encoded channel number 71 (which is a hexadecimal value). The fourth channel number 8 is associated with the channel 8 in the first bank of channels 420. The fourth encoded channel number 71 is associated with the channel 8 in the second bank of channels 422.

Referring to FIG. 11, a seventh table 620 that is utilized by the second monitoring application 400 in the voltage monitoring system 120 is illustrated. The seventh table 620 includes a record 622. The record 622 has a third expected encoded channel number 71 (which is a hexadecimal value). The third expected encoded channel number 71 is associated with the channel 8 in the second bank of channels 422.

Referring to FIG. 12, an eighth table 640 that is utilized by the second monitoring application 400 in the voltage monitoring system 120 is illustrated. The eighth table 640 includes a record 642. The record 642 has a fourth expected encoded channel number D4 (which is a hexadecimal value). The fourth expected encoded channel number D4 is associated with the channel 2 in the first bank of channels 420.

Referring to FIGS. 1 and 4-19, a flowchart of a method for obtaining voltage measurements utilizing the voltage monitoring system 120 will now be explained. The following method is implemented utilizing the main application 397, the first monitoring application 398, the second monitoring application 400, and the hardware abstraction layer 402.

The main application 397 will now be explained.

At step 700, a first channel (e.g., channel 2) of a first bank of channels 420 of an analog-to-digital converter 390 measures a voltage (HSD_Voltage_Sense) on a first voltage feedback line 382 coupled to a high voltage end of a contactor 70, and generates a first measured voltage value. After step 700, the method advances to step 702.

At step 702, a second channel (e.g., channel 8) of a second bank of channels 422 of the analog-to-digital converter 390 measures a voltage (LSD_Voltage_Sense) on a second voltage feedback line 384 coupled to a low voltage end of the contactor 70, and generates a second measured voltage value. After step 702, the method advances to step 704.

At step 704, the microcontroller 380 simultaneously executes first and second monitoring applications 398, 400 and a hardware abstraction layer 402. After step 704, the method returns to step 700.

The first monitoring application 398 will now be explained.

At step 720, the first monitoring application 398 sends a first request message to the hardware abstraction layer 402 that requests the first measured voltage value from the first channel (e.g., channel 2) of the first bank of channels 420 coupled to the first voltage feedback line 382. The first request message has a first encoded channel number (e.g., D4) associated with the first channel (e.g., channel 2) of the first bank of channels 420. After step 720, the method advances to step 722.

At step 722, the hardware abstraction layer 402 determines a first channel number (e.g., 2) by reading a first record 502 of a first table 500 stored in the memory device 396 utilizing the first encoded channel number (e.g., D4) as an index. The first record 502 of the first table 500 has the first encoded channel number (e.g., D4) and the first channel number (e.g., 2) therein. The first channel number is associated with the first channel (e.g., channel 2) of the first bank of channels 420. After step 722, the method advances to step 724.

At step 724, the hardware abstraction layer 402 obtains the first measured voltage value associated with the first channel number (e.g., 2) from the first channel (e.g., channel 2) of the first bank of channels 420 of the analog-to-digital converter 390. After step 724, the method advances to step 726.

At step 726, the hardware abstraction layer 402 determines a second encoded channel number (e.g., D4) by reading a first record 522 of a second table 520 stored in the memory device 396 utilizing the first channel number (e.g., 2) from the first table 500 as an index. The first record 522 of the second table 520 has a second channel number (e.g., 2) and the second encoded channel number (e.g., D4) therein. After step 726, the method advances to step 728.

At step 728, the hardware abstraction layer 402 sends a first response message having the second encoded channel number (e.g., D4) and the first measured voltage value therein to the first monitoring application 398. After step 728, the method advances to step 740.

At step 740, the first monitoring application 398 determines a first expected encoded channel number (e.g., D4) by reading a first record 542 of a third table 540 stored in the memory device 396 utilizing the second encoded channel number (e.g., D4) as index. The first record 542 of the third table 540 has the first expected encoded channel number therein (e.g., D4). After step 740, the method advances to step 742.

At step 742, the microcontroller 380 makes a determination as to whether the second encoded channel number (e.g., D4) is equal to the first expected encoded channel number (e.g., D4). If the value of step 742 equals "yes", the method advances to step 744. Otherwise, the method advances to step 746.

At step 744, the first monitoring application 398 stores the first measured voltage value in the memory device 396 as a first valid voltage value. After step 744, the method advances to step 750.

Referring again to step 742, if the value of step 742 equals "no", the method advances to step 746. At step 746, the first monitoring application 398 commands the microcontroller 380 to generate first and second control signals to transition a contactor 70 to an open operational state. After step 746, the method advances to step 748.

At step 748, the first monitoring application 398 sends a first exchanged message having the second encoded channel number (e.g., D4) to the second monitoring application 400. After step 748, the method advances to step 750.

At step 750, the microcontroller 380 makes a determination as to whether the first monitoring application 398 received a second exchanged message having a fourth encoded channel number (e.g., 71) therein from the second monitoring application 400. If the value of step 750 equals "yes", the method advances to step 752. Otherwise, the method returns to the main application 397.

At step 752, the first monitoring application 398 determines a second expected encoded channel number (e.g., 71) by reading a first record 562 of a fourth table 560 stored in the memory device 396 utilizing the fourth encoded channel number (e.g., 71) as index. The first record 562 of the fourth table 560 has the second expected encoded channel number (e.g., 71) therein. After step 752, the method advances to step 760

At step 760, the microcontroller 380 makes a determination as to whether the fourth encoded channel number (e.g., 71) is equal to the second expected encoded channel number (e.g., 71). If the value of step 760 equals "yes", method advances to step 762. Otherwise, the method returns to the main application 397.

At step 762, the first monitoring application 398 commands the microcontroller 380 to generate third and fourth control signals to transition the contactor 70 to an open operational state. After step 762, the method returns to the main application 397.

The second monitoring application 400 will now be explained.

At step 820, the second monitoring application 400 sends a second request message to the hardware abstraction layer 402 that requests the second measured voltage value from the second channel (e.g., channel 8) of the second bank of channels 422 coupled to the second voltage feedback line 384. The second request message has a third encoded channel number (e.g., 71) associated with the second channel (e.g., channel 8) of the second bank of channels 422. After step 820, the method advances to step 822.

At step 822, the hardware abstraction layer 402 determines a third channel number (e.g., 8) by reading a first record 582 of a fifth table 580 stored in the memory device 396 utilizing the third encoded channel number (e.g., 71) as an index. The first record 582 of the fifth table 580 has the third encoded channel number (e.g., 71) and the third channel number (e.g., 8) therein. The third channel number (e.g., 8) is associated with the second channel (e.g., 8) of the second bank of channels 422. After step 822, the method advances to step 824.

At step 824, the hardware abstraction layer 402 obtains the second measured voltage value associated with the third channel number (e.g., 8) from the second channel (e.g., channel 8) of the second bank of channels 422 of the analog-to-digital converter 390. After step 824, the method advances to step 826.

At step 826, the hardware abstraction layer 402 determines the fourth encoded channel number (e.g., 71) by reading a first record 602 of a sixth table 600 stored in the memory device 396 utilizing the third channel number (e.g., 8) from the fifth table 580 as an index. The first record of the fifth table 580 has a fourth channel number (e.g., 8) and the fourth encoded channel number (e.g., 71) therein. After step 826, the method advances to step 828.

At step 828, the hardware abstraction layer 402 sends the second response message having the fourth encoded channel number (e.g., 71) and the second measured voltage value therein to the second monitoring application 400. After step 828, the method advances to step 840.

At step 840, the second monitoring application 400 determines a third expected encoded channel number (e.g., 71) by reading a first record 622 of a seventh table 620 stored in the memory device 396 utilizing the fourth encoded channel number (e.g., 71) as an index. The first record of the seventh table 620 has the third expected encoded channel number (e.g., 71) therein. After step 840, the method advances to step 842.

At step 842, the microcontroller 380 makes a determination as to whether the fourth encoded channel number (e.g., 71) is equal to the third expected encoded channel number (e.g., 71). If the value of step 842 equals "yes", the method advances to step 844. Otherwise, the method advances to step 846.

At step 844, the second monitoring application 400 stores the second measured voltage value in the memory device 396 as a second valid voltage value. After step 844, the method advances to step 850.

Referring again to step 842, if the value of step 842 equals "no", the method advances to step 846. At step 846, the second monitoring application 400 commands the microcontroller 380 to generate fifth and sixth control signals to transition the contactor 70 to an open operational state. After step 846, the method advances to step 848.

At step 848, the second monitoring application 400 sends the second exchanged message having the fourth encoded channel number (e.g., 71) to the first monitoring application 398. After step 848, the method advances to step 850.

At step 850, the microcontroller 380 makes a determination as to whether the second monitoring application 400 received the first exchanged message having the second encoded channel number (e.g., D4) therein from the first monitoring application 398. If the value of step 850 equals "yes", the method advances to step 852. Otherwise, the method returns to the main application 397.

At step 852, the second monitoring application 400 determines a fourth expected encoded channel number (e.g., D4) by reading a first record 642 of an eighth table 640 stored in the memory device 396 utilizing the second encoded channel number (e.g., D4) as an index. The first record 642 of the eighth table 640 has the fourth expected encoded channel number (e.g., D4) therein. After step 852, the method advances to step 860.

At step 860, the microcontroller 380 makes a determination as to whether the second encoded channel number (e.g., D4) is equal to the fourth expected encoded channel number (e.g., D4). If the value of step 860 equals "yes", the method advances to step 862. Otherwise, the method returns to the main application 397.

At step 862, the second monitoring application 400 commands the microcontroller 380 to generate seventh and eighth control signals to transition the contactor 70 to an open operational state. After step 862, the method returns to the main application 397.

The voltage monitoring system 120 described herein provides a substantial advantage over other systems. In particular, the voltage monitoring system 120 utilizes first and second monitoring applications 398, 400 that are simultaneously being executed. The first monitoring application 398 communicates with the hardware abstraction layer 402 utilizing encoded channel numbers to reliably obtain a desired voltage value from a first bank of channels of analog-to-digital converter 390. Further, if a received encoded channel number from the hardware abstraction layer 402 does not match an expected encoded channel number, the first monitoring application 398 transitions a contactor 70 to an open operational state, and further sends the received encoded channel number to the second monitoring application 400 which also transitions the contactor 70 to an open operational state. Thus, the voltage monitoring system 120 can detect if the system software is obtaining incorrect voltage values from the analog-to-digital converter 390. Further, the voltage monitoring system 120 can take redundant safe action, by having the first and second monitoring applications 398, 400 both open the contactor 70, if an incorrect voltage value is received.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A voltage monitoring system, comprising:
   a first feedback line being coupled to a high voltage end of a contactor;
   a second feedback line being coupled to a low voltage end of the contactor;
   a microcontroller having a first application, a hardware abstraction layer, a digital input-output device, and an analog-to-digital converter with a first bank of channels; a first channel of the first bank of channels being electrically coupled to the first feedback line;
   the first application sending a first request message to the hardware abstraction layer utilizing a call instruction that requests a first voltage value from the first channel, the first request message having a first encoded channel number associated with the first channel;
   the hardware abstraction layer determining a first channel number by reading a first record of a first table stored in a memory device utilizing the first encoded channel number as an index, the first record of the first table having the first encoded channel number and a first channel number therein, the first channel number being associated with the first channel;
   the hardware abstraction layer sending a first response message having a second encoded channel number and a first voltage value from the first channel to the first application; and
   the first application commanding the digital input-output device of the microcontroller to generate first and second control signals that are received by first and second voltage drivers, respectively, to transition the contactor to an open operational state, if the second encoded channel number is not equal to a first expected encoded channel number.

2. The voltage monitoring system of claim 1, wherein:
   the hardware abstraction layer obtaining the first voltage value from the first channel.

3. The voltage monitoring system of claim 1, wherein:
   the first application storing the first voltage value in a memory device as a first valid voltage value if the second encoded channel number is equal to the first expected encoded channel number.

4. The voltage monitoring system of claim 1, wherein the first application determining the first expected encoded channel number by reading a first record of a second table stored in tithe memory device utilizing the second encoded channel number as index, the first record of the second table having the first expected encoded channel number therein.

5. The voltage monitoring system of claim 1, wherein:
the hardware abstraction layer determining the second encoded channel number by reading a first record of a second table stored in the memory device utilizing the first channel number from the first table as an index, the first record of the second table having a second channel number and the second encoded channel number therein; the second channel number being equal to the first channel number.

6. The voltage monitoring system of claim 1, wherein the first encoded channel number is a hexadecimal value.

7. The voltage monitoring system of claim 6, wherein the hexadecimal value is 1-byte in length.

8. The voltage monitoring system of claim 1, wherein the second encoded channel number is a hexadecimal value.

9. The voltage monitoring system of claim 8, wherein the hexadecimal value is 1-byte in length.

10. The voltage monitoring system of claim 1, wherein the first encoded channel number and the second encoded channel number have a Hamming distance of four from one another.

11. The voltage monitoring system of claim 2, wherein:
the first application sending a first exchanged message having the second encoded channel number to the second application, if the second encoded channel number is not equal to the first expected encoded channel number; and
the second application commanding the digital input-output device of the microcontroller to generate third and fourth control signals that are received by the first and second voltage drivers, respectively, to transition the contactor to the open operational state, if the second encoded channel number is not equal to a second expected encoded channel number.

12. The voltage monitoring system of claim 2, wherein:
the second application sending a second request message to the hardware abstraction layer that requests a second voltage value from the second channel of the second bank of channels coupled to the second feedback line, the second request message having a third encoded channel number associated with the second channel of the second bank of channels;
the hardware abstraction layer determining a second channel number based on the third encoded channel number, the second channel number being associated with the second channel of the second bank of channels;
the hardware abstraction layer obtaining a second voltage value associated with the second channel number;
the hardware abstraction layer determining a fourth encoded channel number based on the second channel number;
the hardware abstraction layer sending a second response message having the fourth encoded channel number and the second voltage value therein to the second application; and
the second application commanding the digital input-output device of the microcontroller to generate third and fourth control signals that are received by the first and second voltage drivers, respectively, to transition the contactor to the open operational state, if the fourth encoded channel number is not equal to a second expected encoded channel number.

13. The voltage monitoring system of claim 12, wherein:
the second application sending a first exchanged message having the fourth encoded channel number to the first application, if the fourth encoded channel number is not equal to the second expected encoded channel number; and
the first application commanding the digital input-output device of the microcontroller to generate fifth and sixth control signals that are received by the first and second voltage drivers, respectively, to transition the contactor to the open operational state, if the fourth encoded channel number is not equal to a third expected encoded channel number.

14. The voltage monitoring system of claim 12, herein:
the second application storing the second voltage value in the memory device as a second valid voltage value if the fourth encoded channel number is equal to the second expected encoded channel number.

15. The voltage monitoring system of claim 2, wherein the second application determining the second expected encoded channel number by reading a first record of a second table stored in the memory device utilizing the fourth encoded channel number as index, the first record of the second table having the second expected encoded channel number therein.

16. A voltage monitoring system, comprising:
a first feedback line being coupled to a high voltage end of a contactor,
a second feedback line being coupled to a low voltage end of the contactor,
a microcontroller having a first application, a hardware abstraction layer, and an analog-to-digital converter with a first bank of channels; a first channel of the first bank of channels being electrically coupled to the first feedback line;
the hardware abstraction layer determining a first channel number by reading a first record of a first table stored in a memory device utilizing a first encoded channel number as an index, the first record of the first table having the first encoded channel number and the first channel number therein, the first channel number being associated with the first channel;
the hardware abstraction layer obtaining a first voltage value from the first channel; and
the hardware abstraction layer determining a second encoded channel number by reading a first record of a second table stored in the memory device utilizing the first channel number as an index, the first record of the second table having a second channel number and the second encoded channel number therein; the second channel number being equal to the first channel number.

17. The voltage monitoring system, of claim 16, wherein:
the microcontroller further having a digital input-output device;
the first application commanding the digital input-output device to generate first and second control signals that are received by first and second voltage drivers, respectively, to transition the contactor to an open operational state, if the second encoded channel number is not equal to a first expected encoded channel number.

18. The voltage monitoring system of claim 16, wherein the first encoded channel number is a hexadecimal value, and the second encoded channel number is a hexadecimal value.

19. The voltage monitoring system of claim 18, wherein the first encoded channel number and the second encoded channel number have a Hamming distance of four from one another.

\* \* \* \* \*